Jan. 18, 1938. H. M. LEWIS Re. 20,632
TUNING SCALE
Original Filed Sept. 25, 1931 2 Sheets-Sheet 1
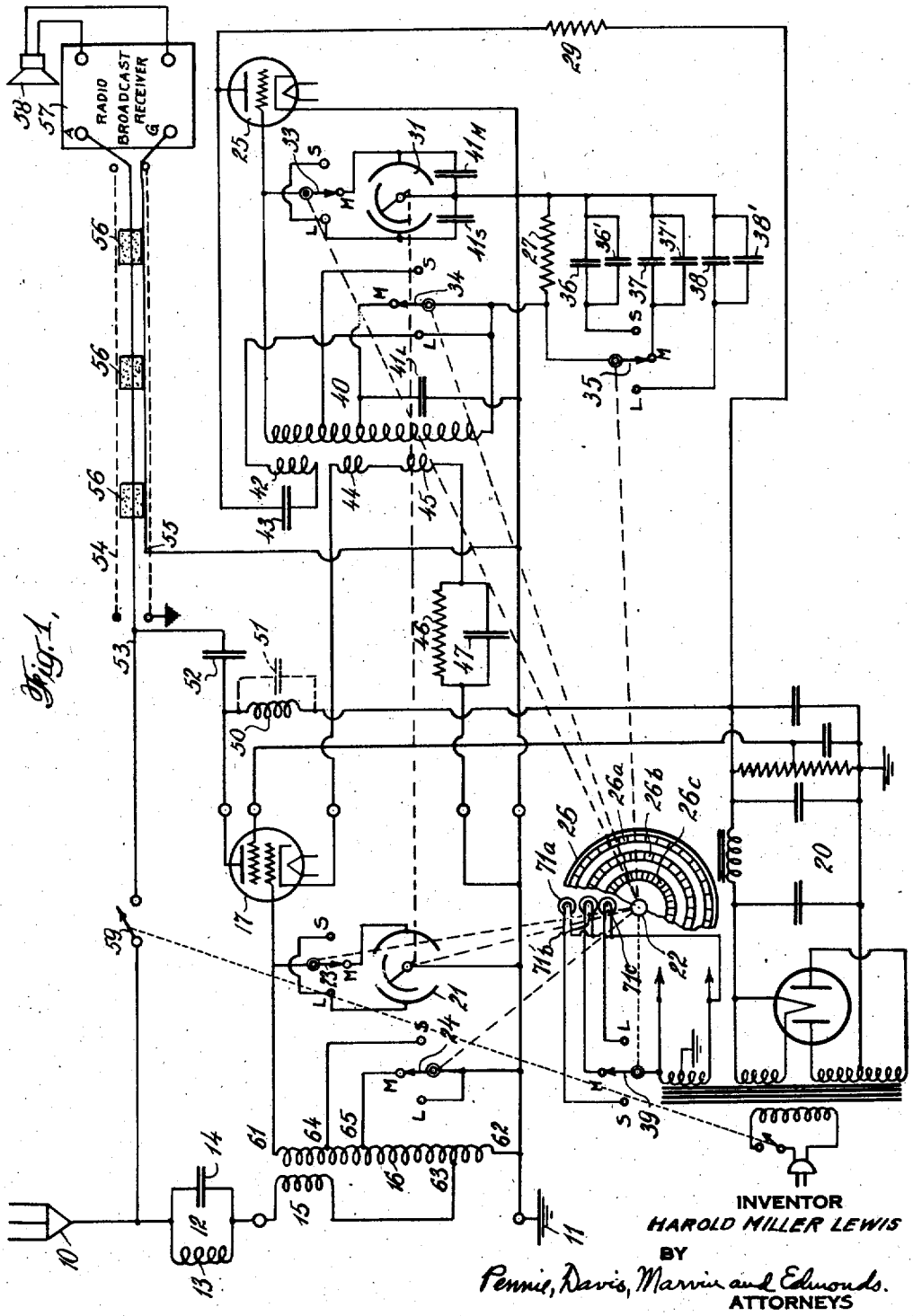
INVENTOR
HAROLD MILLER LEWIS
BY
Pennie, Davis, Marvin and Edmonds.
ATTORNEYS Jan. 18, 1938. H. M. LEWIS Re. 20,632
TUNING SCALE
Original Filed Sept. 25, 1931 2 Sheets-Sheet 2
Fig. 2,
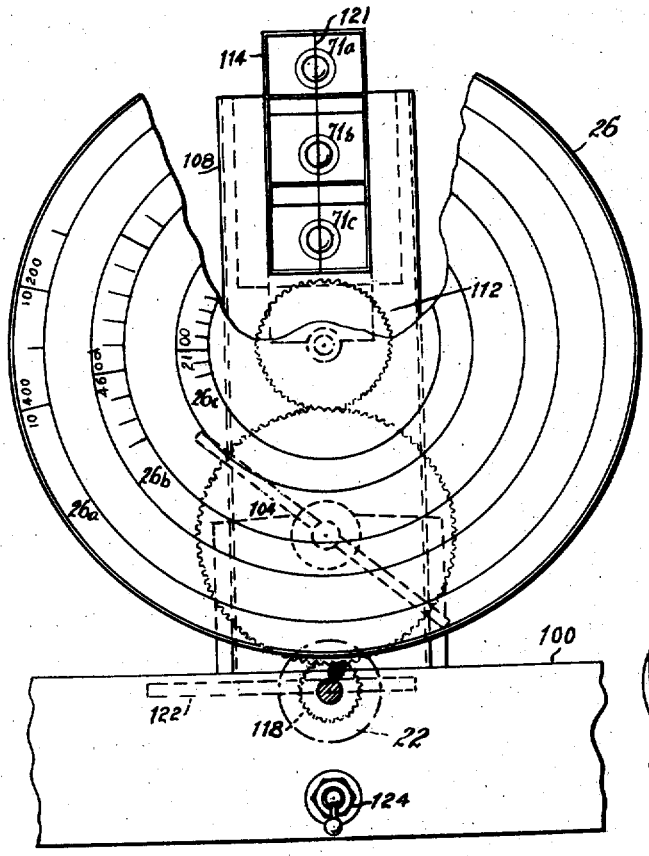
Fig. 3,
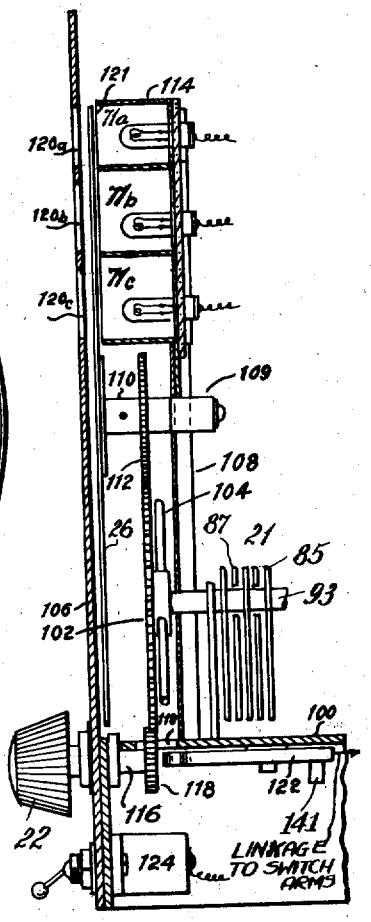
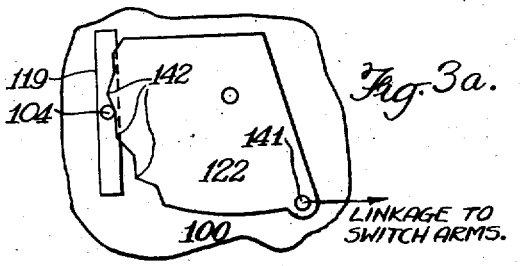
Fig. 3a.
INVENTOR
HAROLD MILLER LEWIS
BY
Pennie, Davis, Marvin and Edmonds,
ATTORNEYS Reissued Jan. 18, 1938

Re. 20,632

UNITED STATES PATENT OFFICE 20,632

TUNING SCALE

Harold Miller Lewis, Great Neck, N. Y., assignor to Hazeltine Corporation

Original No. 1,987,857, dated January 15, 1935, Serial No. 565,027, September 25, 1931. Application for reissue October 2, 1936, Serial No. 103,727

14 Claims. (Cl. 250—40)

The present invention relates to a tuning system, or, more particularly, to such a system as adapted for use in a short wave receiver or converter.

A short wave converter is an apparatus which, when used in conjunction with any broadcast receiver, permits the reception of short wave signals by the said broadcast receiver. The converter comprises an oscillator and modulator, by which the short wave signal currents are converted into currents of a frequency within the tuning range of the broadcast receiver. The current of this frequency, which frequency will be referred to hereinafter as the "intermediate frequency", is amplified, detected and reproduced by the broadcast receiver.

The frequency range covered by the short wave band is approximately from 1500 kc. (200 meters) to 20,000 kc. (15 meters). This range of frequencies is so great that it is not practical to tune a circuit through the entire range by the variation of a single tuning element. Some arrangement must be provided for changing both of the frequency determining elements; that is, both the inductance and the capacity. In accordance with the usual practice, the tuning is actually done by varying the capacity of a variable condenser, and the inductance is changed in steps to permit the condenser to tune the circuit throughout the various portions of the range.

In practicing the present invention, the short wave band is divided into three bands which will be referred to in this application as the "short wave band", the "middle wave band", and the "long wave band".

The inductance used in tuning the radio frequency circuits of the short wave receiver, or the radio frequency circuit and oscillator circuits of a converter, are usually wound on removable forms commonly known as "plug-in" coils, which coils are changed when desiring to go from one of the short wave bands to another. A system of this type has the disadvantages that it is expensive to manufacture and requires shifting of coils when operating.

Various systems have been proposed by which the inductance of the tuning coils is changed in steps by means of switches. However, the leads and switch mechanisms introduce capacities which considerably lessen the range of the tuning condensers, and usually the resulting large number of points to be switched has condemned this system.

However, in the usual receiver or converter in which the inductances are of the "plug-in" coil type, or in which switches are used to change the inductances, the tuning condenser has a single scale which is arbitrarily marked. This requires noting the coil in use or switch position, as well as the condenser setting, when "logging" a station, as it is necessary to know both the scale indication and the inductance in order to tune the circuits to a given frequency.

It is the object of the present invention to overcome the above noted difficulty and to provide an indicating device for a short wave receiving apparatus in which the frequency to which the tuning device is tuned may be recorded, regardless of the band in which the set is being operated, and, further, to provide means by which the frequency band in which the set is being operated is indicated at all times.

Furthermore, the usual scale used in connection with the short wave receiver or converter permits operation of the apparatus with considerably more ease in the long wave band, due to the fact that the movement of the tuning control required to separate the different stations at the long wave end of the band is considerably greater than that required to separate the stations at the short wave end of the band. It is, therefore, the further object of this invention to provide a scale in which the stations are separated by approximately the same amount at both ends of the tuning range.

These and further objects of my invention will become apparent from the following specifications taken in connection with the appended claims and with the accompanying drawings.

In accomplishing the objects of the present invention the inductances of the frequency determining circuit of the oscillator and the input circuit are provided with switches for short-circuiting the long wave and middle wave portions of the winding, when operating the oscillator to receive signals in the middle wave band and short wave band, respectively.

In order to permit continuous rotation of the tuning dial in either direction to progressively tune the converter through the entire band, the condensers used in both the modulator input and oscillator circuits are each provided with double stators and double rotors so constructed that when the capacity between one of the pair of rotors and stators is maximum, that between the other pair of rotors and stators is minimum. This feature is covered more particularly in application of William A. MacDonald for "Condensers," Serial No. 564,997, filed concurrently herewith.

The tuning control knob is geared to the condenser by 4:1 reduction gear. In turn the condenser is geared to the dial by a 2:1 step-up gear so that 180° rotation of the condenser corresponds to a full rotation of the dial. The dial rotates in the direction in which the tuning knob is turned. As the dial moves from left to right the frequencies received become higher. This dial has thereon three indicating scales, the outer scale being for indicating the frequencies in the short wave band, and the inner scale being for indicating the frequencies in the long wave band. The scales pass by indicator lights placed behind the dial within a compartment which permits illumination of but a single scale by each indicator light, and a switch operated simultaneously with the wave changing switches operates to light the appropriate scale. The long wave scale indications appear at the bottom window and the top window permits observation of the short wave scale indications. This arrangement allows a greater spread for the short wave channels of which there are considerably more than the long wave channels.

In order to permit the operation of a single control knob to control the frequency of reception, regardless of which of the three bands the converter is operating in, there is provided a gang switch mechanism operated by means of the condenser control knob at the appropriate instant as the dial is rotated from one to another of the frequency bands. The specific details of the switching arrangement constitute no part of the present invention, but are described fully in copending application of Harold Miller Lewis for "Switching arrangement", Serial No. 565,026, filed concurrently herewith.

It can thus be seen that an arrangement has been provided by which the set can be tuned through the entire short wave band by the operation of a single control, and by which the frequency for which this apparatus is set to respond is automatically indicated at all times as the set is tuned.

Attention is now invited to the accompanying drawings in which:

Fig. 1 is a circuit diagram of a converter embodying the present invention; and

Figs. 2 and 3 are front and side elevations, respectively, of the indicator dial and control arrangement of the converter comprising a part of the present invention.

Fig. 3*a* is an inverted plan view of the switch control mechanism.

Referring now to Fig. 1, the antenna circuit includes the antenna 10, the ground 11, the trap circuit 12, comprising the inductance 13 and condenser 14, the primary winding 15, and a portion of the secondary winding 16. The inductance 13 and the condenser 14 of the trap circuit 12 are so proportioned that said circuit is resonant to the intermediate frequency produced by the short wave converter. The input circuit of the converter is connected to the grid of modulator device 17, which may be any thermionic tube, though that shown is of the screen grid type. The input circuit is tuned by means of the condenser 21, which may be a double condenser employing as shown, a single rotor and two stators so arranged that the capacity obtained between the rotor and one stator is maximum, when the capacity between the rotor and the other stator is minimum. The connections to the stators are controlled by means of the switch 23. The actual condenser includes two stators and two rotors, so arranged that when one rotor is entirely within its stator, the other rotor is entirely out of its stator. This is fully described in the application mentioned above. The function of the condenser and switch arrangement will be explained later.

The tapped secondary 16 is connected by means of switch 24, so that any of the tapped portions of the secondary may be included in the input circuit. The switch is so connected that the unused portions of the winding are short-circuited.

For producing the heterodyne frequency for combining with the incoming signal and thus producing the intermediate frequency, there is provided the oscillator 25. This oscillator tube is of the single grid type and includes in its grid circuit the secondary 40 of the oscillation transformer, the primary 42 of which is connected in the plate circuit which includes stopping condenser 43. The secondary 40 is a tapped winding similar to 16 of the antenna transformer, and the connections to said secondary are controlled by means of switch 34. The grid return of the oscillation circuit is completed through the biasing resistor 27, which is connected to the cathode of the tube 25. The frequency of the oscillation circuit is determined by means of condenser 31, which is similar to condenser 21, and is connected to be operated therewith in a uni-control manner by means of the control knob 22 associated with the indicator dial 26.

The connections to the two portions of the condenser 31 are controlled by means of switch 33.

Padding condensers 41M and 41S are provided across the two portions of condenser, as shown, for the purpose of aligning the oscillation circuit with the input of modulator 17 in the middle wave range and short wave range, respectively. Padding condenser 41L is connected across the long wave portion of the inductance winding 40, so that when the switch 34 is on contact L this condenser is practically in shunt with the condensers 31 and 41S for adjusting the alignment in the long wave range. When the switch 34 is on contact M, the condenser 41L is in shunt with condensers 37 and 37′, and the total series capacity is at that time the sum of these three condensers.

In series with condenser 31 are provided series condensers 36, 37 and 38, the connections to which are controlled by means of the switch 35. Each of these condensers is provided with the padding condenser 36′, 37′, or 38′, respectively, for the purpose of correcting the alignment of oscillator circuit with the modulator input in the various frequency bands. In the middle frequency band, as has just been stated, the condenser, 41L is in shunt with 37 and 37′. Coupling coils 44 and 45 coupled to the middle and long wave portions of the secondary 40, respectively, are included in the cathode circuit of the modulator 17. This circuit also includes the biasing resistor 46 shunted by by-pass condenser 47 for the purpose of causing tube 17 to act as a modulator.

The plate and screen grid potential are provided by means of the power supply source 28 which, as shown, is of the ordinary double wave rectifier and filter type. This power supply also provides heater lighting current for heating the cathodes of tubes 17 and 25. A resistor 29 is included in the plate lead of the modulator 25 for the purpose of reducing the plate potential thereof.

As shown, the dial 26 includes three scales, 26*a*, 26*b*, and 26*c*, these scales covering the short wave band, middle wave band, and long wave band, respectively.

It is to be noted that in order to get better spacing of the frequency indicators, the short wave scale is placed in the outer position on the dial 26, as the condenser motion to get the frequency separation required to separate the various stations is less in the short wave band than it is in the long wave band.

In furtherance of this general idea, the tuning condensers may be chosen to give a straight-line frequency characteristic, which gives an equal frequency spaced scale, and if it is desired the circumference of the various scales, and hence their radii, may be properly chosen so that all of the scales shall have the same uniform frequency spacing.

With this arrangement, adjustment of the tuning condenser 21 between the limits of its capacitance range causes the circuit 16, 21 to be tuned over a band of frequencies having a ratio between the limiting frequencies of the band which is the same irrespective of which portion of the secondary winding 16 is utilized, but increasing in mean frequency and in actual band width as the active portion of the winding 16 is decreased. Hence, if scales of the same length are utilized for all of the frequency bands to which the system is tunable, the spacings between indicia representing like frequency separations on the scales and, thus, the adjustments of the tuning condenser 21 become successively less in the order of increasing mean frequencies of the bands and inversely proportional to the mean frequencies of the bands, or:

$$S_3:S_2:S_1=F_1:F_2:F_3$$

where $S_1$, $S_2$, and $S_3$ are the spacings between indicia representing a given frequency separation on the respective scales corresponding to bands having successively lower mean frequencies $F_1$, $F_2$, and $F_3$.

By making the portion of the scales, corresponding to a given displacement of the tuning element, for the successively higher frequency bands of successively greater lengths, as, for example, by increasing the radius of the scales in the manner illustrated, the relation given above is modified to the extent that:

$$S_1:S_2:S_3<F_3:F_2:F_1$$

$$S_3:S_2:S_1>F_1:F_2:F_3$$

From this last relation it is apparent that like frequency separations on the individual scales are in a ratio, from scale to scale, in the order of decreasing frequency, which is greater than the inverse ratio of the mean frequencies of the corresponding frequency bands. It is pointed out that the term "spacing" is used herein to denote the average distance between adjacent indicia of the scale, in order to make the relations herein stated perfectly general and independent of the capacitance law of the tuning element used, that is, whether it is of the straight-line frequency type or of the straight-line capacitance or other suitable type.

By properly proportioning the lengths of the scales, corresponding to a given displacement of the tuning element, like frequency separations may be made to have the same length spacings on the several scales. For example, assume that the length of each scale corresponds to the same total displacement of the tuning element and assume also bands of 1600–3200 kilocycles, 3200–6400 kilocycles, and 6400–12,800 kilocycles having band widths of 1600 kilocycles, 3200 kilocycles, and 6400 kilocycles, respectively, and mean frequencies of 2400 kilocycles, 4800 kilocycles, and 9600 kilocycles, respectively. With these bands a 2 to 1 ratio is required between the diameters or radii of the successive scales if the scale spacing is to be equal on all three scales. Then the radius of the middle wave scale will be twice that of the long wave scale, and the radius of the short wave scale will be twice that of the middle wave scale or four times that of the long wave scale.

For the purpose of indicating in which of the frequency ranges the converter is operating, each of the scales is provided with one of the illuminating lights 71a, 71b, or 71c, controlled by means of switch 39 to light them when tuning through the short wave band, middle wave band, and long wave band, respectively.

Switches 23, 24, 33, 34, 35 and 39 are so arranged as to be simultaneously operated and also to be actuated by the control knob 22 as the condensers are tuned through the limiting capacities for one of the frequency bands. Thus, the rotation of the control knob 22 results in the actuation of the switches 23 and 33, resulting in switching of the connections to condensers 21 and 31, respectively, to give the opposite capacity extreme for the modulator and oscillator circuits. Switch 39 is simultaneously operated changing the lighting of tne indicating lights and thus indicating the change in the frequency band by changing the indication from one to another of the scales. Although specific means for actuating the switches constitute no part of the present invention, and are described fully in application, Serial No. 565,026, referred to above, they will be described briefly hereinafter.

Included in the plate supply to the modulator 17 is the inductance 50. This inductance may have a high inherent capacity as indicated by capacity 51, or an actual condenser may be placed in shunt therewith. The inductance and capacity, however, are so proportioned that frequencies other than the desired intermediate frequency will be by-passed.

A connection from the output of modulator 17 is made through condenser 52 and lead 53 to the antenna binding post of the receiver 57. This connection is made through a shielded cable 54, which may, for example, be a BX cable, from the walls of which the lead 53 is spaced by means of bakelite spacers 56. Also connected through the cable 54 is the ground connection 55, which is connected to the ground binding post of receiver 57. The capacity 52 and the inherent capacity between the leads 53 and 55 are so proportioned that they constitute a dummy antenna to properly load the modulator 17, and to prevent misalignment of the input of receiver 57. Switch 59 is provided between the antenna 10 and the lead 53 by means of which the antenna may be directly connected to the input of the receiver 57 when it is desired to receive signals in the broadcast band directly on receiver 57.

The receiver 57 may be of any well known type, and is provided with the usual sound reproducing device 58. The specific details of neither 57 nor 58 constitute any part of the present invention.

The receiver is tuned to the intermediate frequency which it is desired to utilize, preferably 1,000 kc. The direct reception of signals of 1,000 kc., when the set is being operated to receive short wave signals by means of the converter, is prevented by means of the shielded cable 54. The modulator is prevented from acting as an amplifier of signals of 1,000 kc. frequency by means of trap circuit 12. Any signals of a frequency other than 1,000 kc. in the output of modulator 17 would be excluded by the inductance 50. It is thus seen that a number of provisions have been made to prevent the interference of broadcast signals with the short wave signals being received by means of the converter.

Attention is now invited to Figs. 2, 3 and 3a which show front and side elevations, and inverted plan view respectively, of the indicator dial and condenser and switch control mechanism. The chassis of the converter is represented at 100, and has the condenser 21 mounted thereon in a central position, a portion only of which is shown in Fig. 2. The shaft 93 of the condenser has a gear 102 and a switch throw-bar 104 secured on the end thereof, the function of which will be described more fully hereinafter.

The control knob 22 is mounted on shaft 116 and is journaled in the front of the chassis 100. A gear 118, secured to said shaft, meshes with the gear 102. The gears 102 and 118 are so proportioned that a 1:4 ratio is provided. For permitting this engagement the chassis 100 is provided with an opening or cutaway portion 119, which also permits the switch throw-bar 104 to pass therethrough and engage the switch shifting gear 122.

Also mounted on the chassis 100 are the vertical supporting member 108 and the front panel member 106. Mounted in the vertical member 108 is the journal 109, in which is journaled the shaft 110 to which is secured the indicator dial 26. Secured also to the shaft 110 is the gear 112 which meshes with the gear 102 on the condenser shaft 93.

Mounted upon the vertical member 108 is the hood member 114 providing three small compartments in which are mounted the indicator lights 71a, 71b and 71c. It can be seen that the dial 26 passes over the front of the compartments and the light passing therethrough is framed by the viewing window openings 120a, 120b, and 120c, respectively, cut in the panel member 106.

A vertical wire 121 is arranged over the openings in the front of chambers 114 to provide an index mark which is visible only through that portion of the dial which is illuminated by one of the lights 71.

The switch 124 is provided for controlling the power supply to the converter.

The gear 112 has half as many teeth as the gear 102, and the gear 118 has one-fourth as many. Thus it can be seen that the scale 26 will rotate once for every half revolution of the condenser shaft 93, and for every two revolutions of the tuning control knob.

The switch-throw bar 104 passes through an opening 119 in the chassis 100 and engages the teeth 142 of the switch-shifting gear 122 which latter is pivoted beneath the chassis. The pin 141 on the gear 122 is connected by any appropriate linkage to control the motion of the switch arms of the gang switch. Each time the condenser rotor has made one half revolution, one end of the throw-bar engages a tooth 142 of the gear 122 and rotates it through a small angle. Thus the switch throw-bar 104 actuates a gang switch so that each time the condenser rotor has made one-half revolution, the switch, full details of which are shown in the copending application referred to above, will be actuated to change the connections to shift the frequency band in one direction or the other. The switch 39 which is included in the gang switch operates to light the appropriate indicator light, and thus the scale in which the apparatus is set to operate is indicated at all times.

Whereas, the above description of the features of the present invention refers particularly to a converter for converting the incoming short wave signal to a current of a frequency within the broadcast band to which an ordinary receiver can tune, it is obvious that the features relating to a tuning system and indicating system as required in the short wave band are equally applicable to a short wave receiver of the ordinary type.

What is claimed is:

1. In a receiver adapted to receive signals covering in a broad wave length band in which an inductance is varied in steps to permit tuning through various portions of the band, means including a variable condenser for tuning said receiver over each of various portions of said band, said means effecting progressively increasing frequency adjustments for a given adjustment of said condenser in the higher frequency portions of said band, an indicator dial operative with said variable condenser, a plurality of scales on said dial, said scales being spaced from the center of said dial by such a distance that they each have substantially the same frequency indication separation, an indicating means for indicating the position of said variable condenser, and means for changing the scale relative to which said indicating means is effective as the inductance of a circuit of the receiver is altered in steps.

2. In a radio receiver adapted to receive signals covering a broad wave length band, which includes an inductance variable in steps to permit tuning throughout various portions of said band, the combination of means including a variable tuning element for tuning said receiver over each of said various portions of said band, said means effecting progressively increasing frequency adjustments for a given adjustment of said element in the higher frequency portions of said band, a dial associated with said element and movable therewith, a plurality of frequency calibrated scales on said dial, the radii of the scales for the short wave lengths being greater than the radii of those for the long wave lengths, and the length of the portions of the scales for the short wave lengths corresponding to a given displacement of said tuning element being substantially greater than those of the scales for the long wave lengths, means for indicating the frequency to which said receiver is tuned to respond, and means for designating the scale relative to which said indicating means is effective as said inductance is varied in steps.

3. In a receiver adapted to receive signals covering a broad wave length band in which an inductance is varied in steps to permit tuning through various portions of the band, means including a variable condenser for tuning said receiver, said means effecting progressively increasing frequency adjustments for a given adjustment of said condenser in the higher frequency portions of said band, a plurality of scales operatively related to said condenser for indicating the frequency to which said receiver is tuned, the portions of the scales corresponding to a given displacement of said variable condenser for the successive short wave portions of the band being of progressively greater length than those for the long wave portion of said band, an indicating means for indicating the position of said variable condenser, and means for designating the scale relative to which said indicating means is effective as the inductance of a circuit of the receiver is altered in steps.

4. In a radio receiver for receiving radio signals covering a broad frequency band and employing reactance elements variable in steps to permit tuning throughout the various portions of the band, the combination with means including a variable reactance element for tuning throughout the various portions of the band, said means effecting progressively increasing frequency adjustments for a given adjustment of said variable reactance element in the higher frequency portions of said band, of a plurality of scale means, each of different length and each bearing indices of the frequencies covered by said variable reactance element while operating to tune within the respective portions of said band, a frequency-indicating means for cooperation with said scales, means for moving said scales and said indicator means relative to each other as said variable reactance element is varied to tune said receiver, and means for causing the scales having the longer portions corresponding to a given displacement of said variable reactance element and the indicating means to cooperate to indicate frequencies in the high-frequency portions of said band and the scales having the shorter portions corresponding to said given displacement and the indicating means to cooperate to indicate frequencies in the low-frequency portions of said band.

5. In a radio receiver for tuning in a plurality of frequency bands means including a tuning element continuously variable for tuning said receiver over each of various portions of said band, said means effecting progressively increasing frequency adjustments of said condenser in the higher frequency portions of said band, and a tuning element variable in steps, scales associated with said continuously variable element for indicating frequency in each of said bands, the portion of each scale, corresponding to a given displacement of said tuning element, being longer as the frequency band to which it relates is higher, a control means for varying said continuously variable element and for moving said scales relative to an index and means for indicating the scale in use.

6. In a radio receiver for tuning over a plurality of frequency bands, a tunable circuit including a first tuning element continuously variable over each of said bands, said means effecting progressively increasing frequency adjustments for a given adjustment of said first tuning element in the bands having progressively higher mean frequency, and a second tuning element adjustable in steps corresponding to said bands, scales for indicating in each of said bands the frequency to which said variable tuning element is adjusted, the portion of each scale, corresponding to a given displacement of said first tuning element, being longer as the frequency band to which it relates is higher, means associated with said second tuning element for selecting the scale corresponding to the band for reception in which said second tuning element is adjusted, and means controlling simultaneously the variation of said variable tuning element and the indication on said selected scale of the frequency to which said receiver is tuned.

7. In a multi-band radio receiver adapted to receive signals in a broad frequency range including a plurality of frequency bands, reactance means adjustable in steps for selectively tuning said receiver to any of said bands, means including a variable reactance element for tuning throughout each of said bands, said means effecting progressively increasing frequency adjustments for a given adjustment of said variable reactance element in the higher frequency bands, a plurality of scales individually corresponding to said frequency bands and having different lengths with the scale having the longest portion corresponding to a given displacement of said variable reactance element bearing indicia of the frequencies included in the highest frequency band and the scales having the successively shorter portions corresponding to said given displacement bearing indicia of the frequencies individually included in the successively lower frequency bands, whereby like frequency separations of the individual scales are in a ratio, from scale to scale in the order of decreasing band frequency, which is greater than the inverse ratio of the mean frequencies of the corresponding bands, and indicating means cooperating with said scales.

8. In a multi-band radio receiver adapted to receive signals in a broad frequency range including a plurality of frequency bands, reactance means adjustable in steps for selectively tuning said receiver to any of said bands, means including a variable reactance element for tuning throughout each of said bands, said means effecting progressively increasing frequency adjustments for a given adjustment of said variable reactance element in the higher frequency bands, a plurality of scales individually corresponding to said frequency bands and having different lengths with the scale having the longest portion corresponding to a given displacement of said variable reactance element bearing indicia of the frequencies included in the highest frequency band and the scales having the successively shorter portions corresponding to said given displacement bearing indicia of the frequencies individually included in the successively lower frequency bands, whereby like frequency separations on the individual scales are in a ratio, from scale to scale in the order of decreasing band frequency, which is greater than the inverse ratio of the mean frequencies of the corresponding bands, and an index cooperating with said scales, said index and scales being relatively movable in response to adjustment of said variable reactance element.

9. In a multi-band radio receiver adapted to receive signals in a broad frequency range including a plurality of frequency bands, reactance means adjustable in steps for selectively tuning said receiver to any of said bands, means including a variable reactance element for tuning throughout each of said bands, said means effecting progressively increasing frequency adjustments for a given adjustment of said variable reactance element in the higher frequency bands, a plurality of scales individually corresponding to said frequency bands and having different lengths with the scale having the longest portion corresponding to a given displacement of said variable reactance element bearing indicia of the frequencies included in the highest frequency band and the scales having the successively shorter portions corresponding to said given displacement bearing indicia of the frequencies individually included in the successively lower frequency bands, whereby like frequency separations on the individual scales are in a ratio, from scale to scale in the order of decreasing band frequency, which is greater than the inverse ratio of the mean frequencies of the corresponding bands, an index cooperating with said scales for indicating, on the scale corresponding to the band to which said receiver is tuned, the frequency to which said receiver is tuned, and means responsive to adjustment of said adjustable reactance means for indicating the scale corresponding to the band to which the receiver is tuned.

10. In a multi-band radio receiver adapted to receive signals in a broad frequency range including a high-frequency band and a low-frequency band, reactance means adjustable selectively to tune said receiver to either of said bands, means including a variable reactance element for tuning throughout each of said bands, said means effecting greater frequency adjustments for a given adjustment of said variable reactance element in the band of higher frequencies, a first scale bearing indicia of the frequencies included in said low-frequency band, a second scale bearing indicia of the frequencies included in said high-frequency band, the portion of said second scale, corresponding to a given displacement of said variable reactance element, being longer than said first scale, whereby given frequency separations on that of said second scale are in a ratio to like frequency separations on said first scale which is greater than the inverse ratio of the mean frequencies of the corresponding bands, and indicating means cooperating with said scales.

11. In a multi-band radio receiver adapted to receive signals in a broad frequency range including a high-frequency band and a low-frequency band, reactance means adjustable selectively to tune said receiver to either of said bands, means including a variable reactance element for tuning throughout each of said bands, said means effecting greater frequency adjustments for a given adjustment of said variable reactance element in the band of higher frequencies, a first scale bearing indicia of the frequencies included in said low-frequency band, a second scale bearing indicia of the frequencies included in said high-frequency band, said second scale having a portion corresponding to a given displacement of said variable reactance element which is longer than that of said first scale, whereby given frequency separations on said second scale are in a ratio to like frequency separations on said first scale which is greater than the inverse ratio of the mean frequencies of the corresponding bands, an index cooperating with said scales, said index and scales being relatively movable in response to adjustments of said variable reactance element, and means responsive to adjustment of said adjustable reactance means for indicating the scale corresponding to the band to which said receiver is tuned.

12. In a multi-band radio receiver adapted to receive signals in a broad frequency range including a high-frequency band and a low-frequency band, reactance means adjustable selectively to tune said receiver to either of said bands, means including a variable reactance element for tuning throughout each of said bands, said means effecting greater frequency adjustment for a given adjustment of said variable reactance element in the band of higher frequencies, a dial having thereon a pair of continuously visible scales, one of said scales bearing indicia of the frequencies included in said low-frequency band, the other of said scales bearing indicia of the frequencies included in said high-frequency band and having the portion corresponding to a given adjustment of said variable reactance element substantially longer than that of said one of said scales, whereby given frequency separations on said other of said scales are in a ratio to like frequency separations on said one of said scales which is greater than the inverse ratio of the mean frequencies of the corresponding bands, an index, said index and scales being relatively movable in response to adjustment of said variable reactance element to indicate on the scale, corresponding to the band to which said receiver is tuned, the frequency to which said receiver is tuned, and means for selectively illuminating the scales to indicate the scale corresponding to the band to which said receiver is tuned.

13. In a multi-band radio receiver adapted to receive signals in a broad frequency range including a plurality of frequency bands, reactance means adjustable in steps for selectively tuning said receiver to any of said bands, means including a variable reactance element for tuning throughout each of said bands, said means effecting progressively increasing frequency adjustments for a given adjustment of said variable reactance element in the bands of higher frequencies, a plurality of scales individually corresponding to said frequency bands, said scales having portions corresponding to a given adjustment of said variable reactance element increasingly longer in the bands of higher frequencies, the relation between said scales and the reactances of said tuning means being such that like frequency separations on the individual scales are in a ratio, from scale to scale in the order of decreasing band frequency, which is greater than the inverse ratio of the mean frequencies of the corresponding bands, and indicating means cooperating with said scales.

14. In a multi-band radio receiver adapted to receive signals in a broad frequency range including a high-frequency band and a low-frequency band, reactance means adjustable selectively to tune said receiver to either of said bands, means including a variable reactance element for tuning throughout each of said bands, said means effecting greater frequency adjustment for a given adjustment of said variable reactance element in the band of higher frequencies, a first scale bearing indicia of frequencies in said low-frequency band, a second scale bearing indicia of the frequencies included in said high-frequency band, the portions of said second scale corresponding to a given adjustment of said variable reactance element being substantially longer than that of said first scale, the relation between said scales and the reactances of said tuning means being such that given frequency separations on said second scale are in a ratio to like frequency separations on said first scale which is greater than the ratio of the mean frequency of the low-frequency band to the mean frequency of the high-frequency band, and indicating means cooperating with said scales.

HAROLD MILLER LEWIS.